US006643206B2

(12) United States Patent
Shirley

(10) Patent No.: US 6,643,206 B2
(45) Date of Patent: *Nov. 4, 2003

(54) TIMING FUSE METHOD FOR DELAYING SIGNALS IN A MEMORY DEVICE

(75) Inventor: Brian M. Shirley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/008,409

(22) Filed: Nov. 13, 2001

(65) Prior Publication Data

US 2002/0039318 A1 Apr. 4, 2002

Related U.S. Application Data

(62) Division of application No. 09/005,815, filed on Jan. 12, 1998, now Pat. No. 6,317,370.

(51) Int. Cl.[7] .................................. G11C 7/00
(52) U.S. Cl. ...................... 365/225.7; 365/200
(58) Field of Search ............................. 365/200, 225.7, 365/193, 194

(56) References Cited

U.S. PATENT DOCUMENTS

| 4,723,227 A | 2/1988 | Murotani | 365/200 |
| 5,274,591 A | 12/1993 | Waller et al. | 365/189.05 |
| 5,281,868 A | 1/1994 | Morgan | 307/441 |
| 5,329,237 A | 7/1994 | Horsh et al. | 324/501 |
| 5,528,539 A | 6/1996 | Ong et al. | 365/200 |
| 5,652,721 A | 7/1997 | McIntyre | 365/185.18 |
| 5,680,544 A | * 10/1997 | Edmondson et al. | 714/42 |
| 5,801,995 A | 9/1998 | Masumoto | 365/189.05 |
| 5,845,315 A | 12/1998 | Cutter | 711/104 |
| 6,317,370 B2 | * 11/2001 | Shirley | 365/200 |

* cited by examiner

Primary Examiner—Richard Elms
Assistant Examiner—Jung H. Hur
(74) Attorney, Agent, or Firm—Scwegman, Lundberg, Woessner & Kluth, P.A.

(57) ABSTRACT

A fuse option for a dynamic random access memory (DRAM) is provided to selectively slow row address signals when redundant rows of memory cells have been selected for use. The fuse option is blown when a redundant row is used to replace a defective row as identified during manufacture of a DRAM. The fuse is coupled to delay circuitry which has a known delay. When the fuse is blown after detecting a defective row, the delay circuitry is coupled in series with selected portions of a row address strobe (RAS) chain of circuitry used to propagate row address selection signals to the proper rows. This provides extra time needed for row address compare and override circuitry, which is not in series with the delay circuitry.

25 Claims, 3 Drawing Sheets

FIG. 4
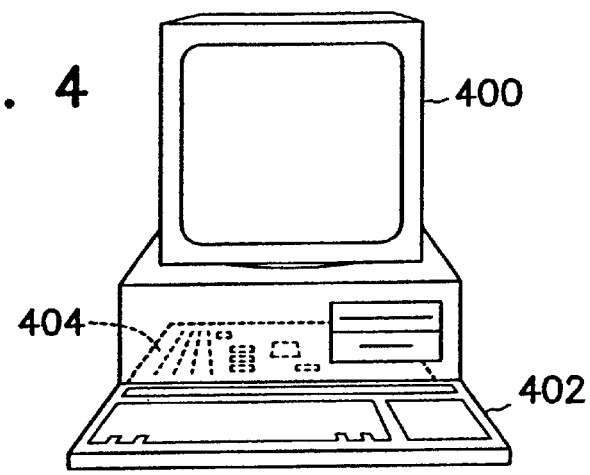
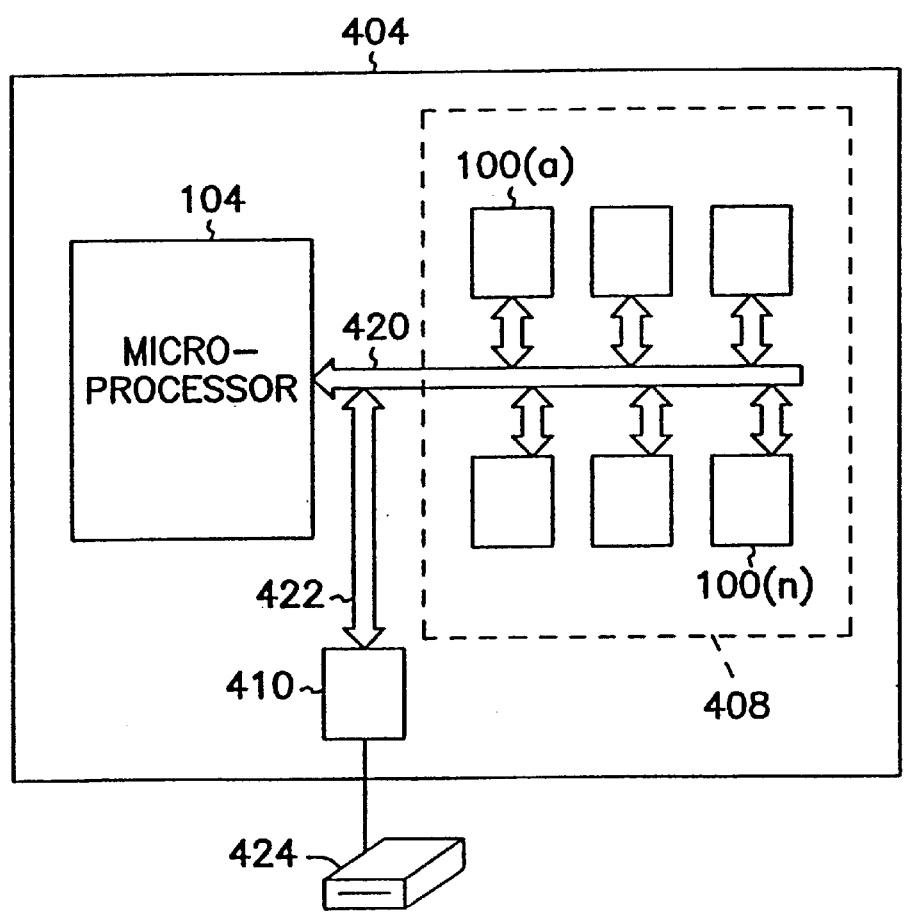
FIG. 5

TIMING FUSE METHOD FOR DELAYING SIGNALS IN A MEMORY DEVICE

This application is a Divisional of U.S. Ser. No. 09/005,815 filed Jan. 12, 1998U.S. Pat. No. 6,317,370.

FIELD OF THE INVENTION

The present invention relates to semiconductor based memory devices, and in particular to controlling timing in a dynamic random access memory (DRAM) based on row repair.

BACKGROUND OF THE INVENTION

Semiconductor memory devices are becoming more and more complex as their size decreases and their storage density increases. To help handle some of the increase in storage density, an architecture comprising multiple subarrays of memory cells on a die for storing values such as bits has been adopted in dynamic random access memory (DRAM) devices. Each of the subarrays comprises multiple rows of memory cells that are accessed or "fired" by activation of row address signals. Occasionally, during manufacture, one or more rows is defective. Some of these rows may be replaced via a fuse option with redundant rows such as shown in U.S. Pat. No. 5,528,539 to Ong et. al. When a redundant row is used, the DRAM's internal timing needs to be slightly slowed down, to provide extra time for address compare and override to the redundant rows. Repair of DRAMs during manufacturing happens on a manageably small percentage of parts, often less than 50%. Therefore, it is not desirable to slow down every die regardless of row repair. In fact, it is desired to obtain faster row access speeds if possible.

Prior solutions have included providing circuits on the die that poll every redundant row bank on the die. If any are enabled, the RAS chain is slowed down. Such schemes, while easy to implement on smaller generation DRAMs, mandate a large number of line spaces and gates for the polling operation on higher density generation DRAMS, since there may be 16 to 64 row banks or more that are checked. This consumes valuable die space and adversely impacts efforts to further increase DRAM density.

There is a need for slowing down the RAS chain when redundant rows are used. There is a further need to only slow down the RAS chain when such redundant rows are in use. There is a need to slow down the RAS chain without using significant additional circuitry. In fact, it would be beneficial to reduce the amount of circuitry currently used to determine that the RAS chain needs to be slowed down.

SUMMARY OF THE INVENTION

A fuse option is provided in a memory device to selectively slow row address signals when redundant rows of memory cells have been selected for use. The fuse option is blown when a redundant row is used to replace a defective row as identified during manufacture of a chip. Use of the fuse allows removal of multiple lines and gates used to poll row banks to determine if a redundant row was in use. The removal of such lines and gates creates more room for other circuitry, contributing to the ability to create higher density memory devices.

In one embodiment, a fuse is coupled to delay circuitry which has a known delay. When the fuse is blown after detecting a defective row, the delay circuitry is coupled in series with selected portions of a row address strobe (RAS) chain of circuitry used to propagate row address selection signals to the proper rows. This provides extra time needed for row address compare and override circuitry, which is not in series with the delay circuitry.

In a further embodiment, an antifuse takes the place of the fuse and is coupled such that when it is set, the delay circuitry is appropriately coupled into the path of selected portions of the RAS chain. The present invention is usefully in the design and manufacture of dynamic random access memory (DRAM) devices.

BRIEF DESCRIPTION OF THE DRAWINGS

FIG. 4 illustrates a computer in which the present invention may be used.

FIG. 5 illustrates a block diagram of an interface for a microprocessor and a memory device of FIG. 2.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The terms wafer and substrate used in the following description include any semiconductor-based structure having an exposed surface with which to form the integrated circuit structure of the invention. Wafer and substrate are used interchangeably to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The following detailed description is, therefore, not to be taken in a limiting sense, and the scope of the present invention is defined by the appended claims.

Figure 1:
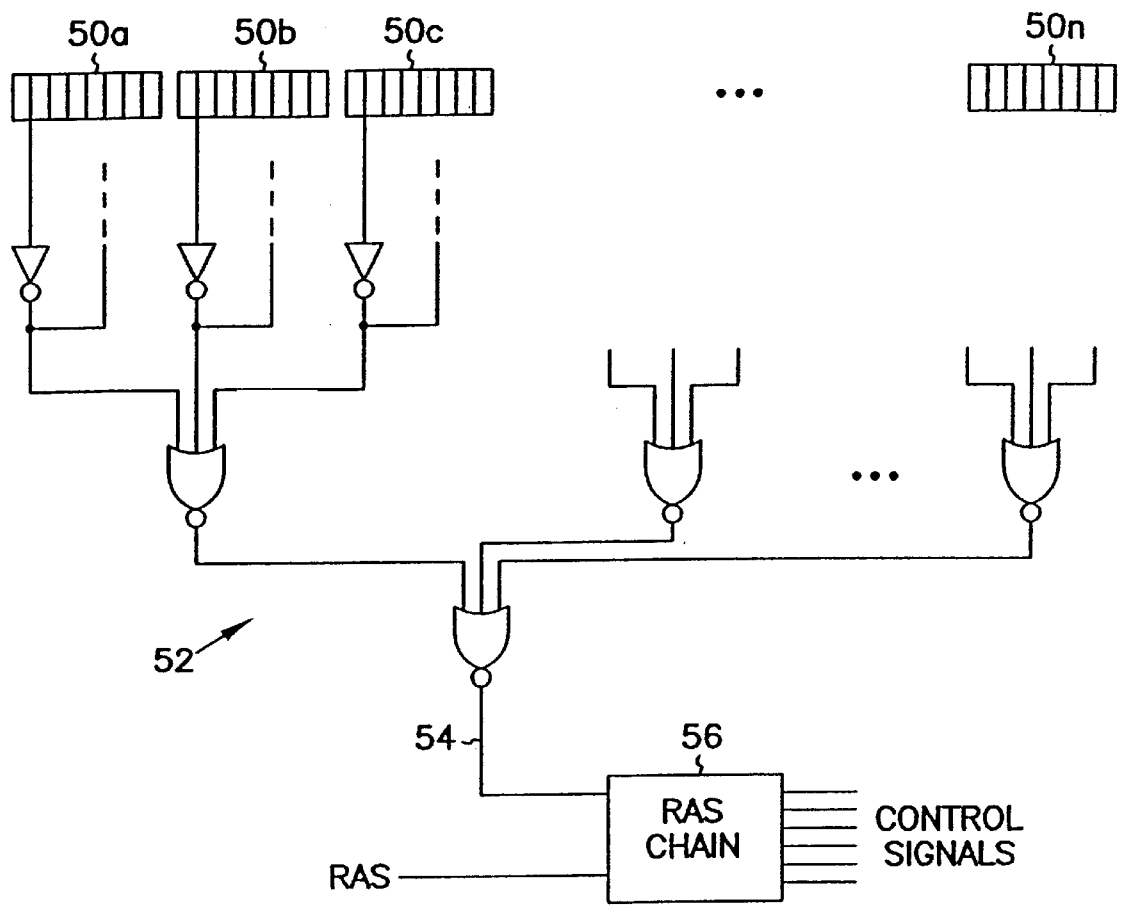
FIG. 1 is a logic schematic diagram of a prior art polling technique for fast/slow RAS chain control.

FIG. 1 is a prior art drawing of a logic level schematic showing how the RAS chain is typically slowed down based upon the polling of every redundant row fuse bank on the die. Fuse bank 50A corresponds to the fuse bank for a memory subarray which controls whether redundant rows have been used to replace a defective row of the memory sub array. A plurality of fuse banks such as 50A, 50B, 50C, . . . , 50N, may be found for a dense memory array comprised of N sub arrays. The fuses are polled by a polling network of combinational logic 52, shown in FIG. 1. The result of the combinational logic is a single signal 54 which corresponds to a fast or slow control signal. This signal controls the RAS chain to instruct the RAS chain to either go fast in the case of no redundant rows being substituted for defective rows, or slow if any one row had been replaced with a redundant row. The fuses of fuse banks 50A . . . 50N may be fuses, anti-fuses, laser fuses and the like. The slowing of the RAS chain is to compensate for the increased time required for address matching and override in the case of the use of a redundant substituted row. Those skilled in the art will readily recognize that the type of fuses used in the fuse bank will effect the type of combinational logic 52 required to produce the appropriate fast slow signal 54.

Figure 2:
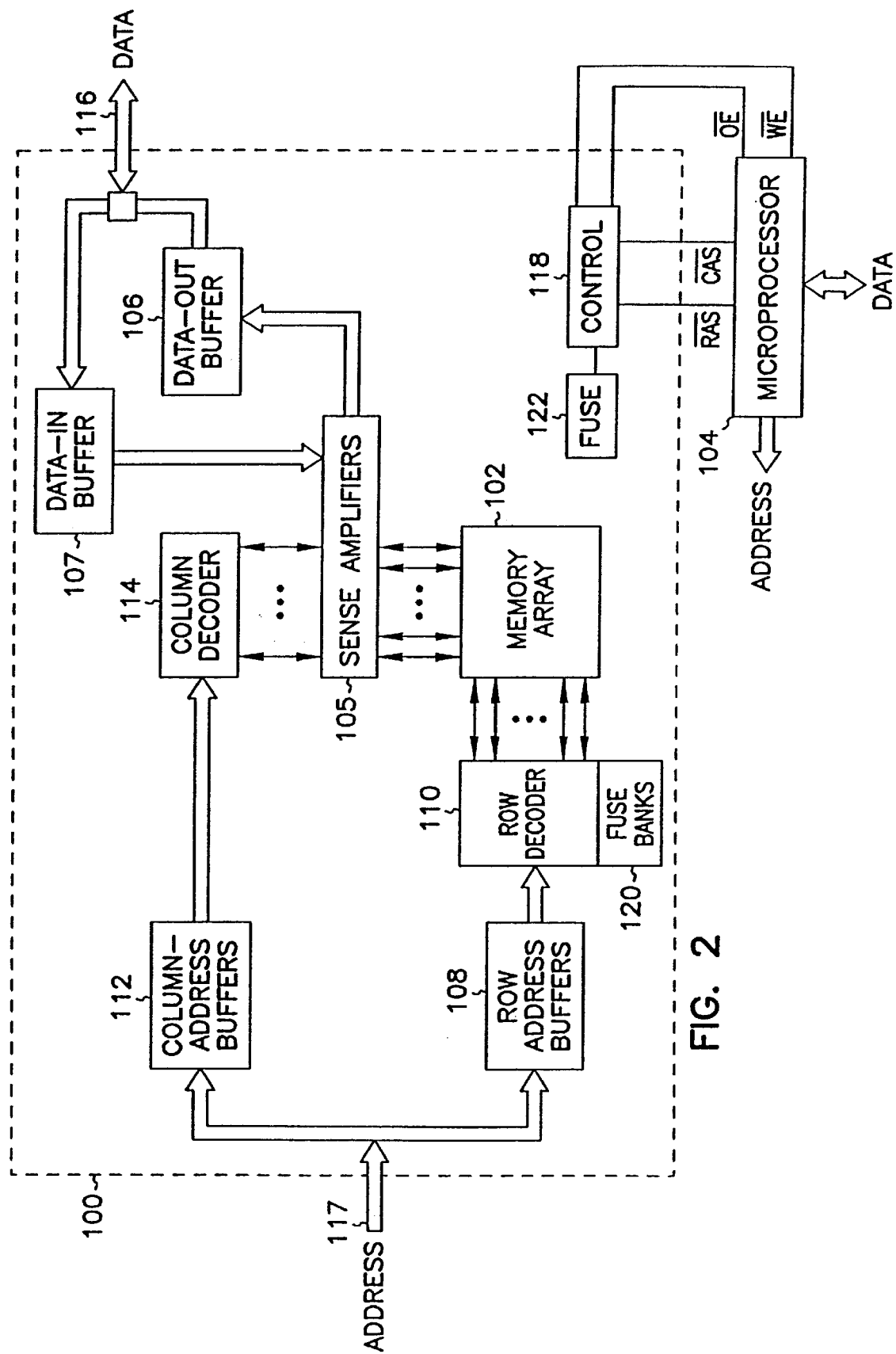
FIG. 2 is a block diagram of dynamic random access memory (DRAM) device with a fuse option to control the fast/slow RAS chain.

FIG. 2 is a block diagram of an illustrative embodiment of the present invention. A DRAM 100 includes a memory array 102 formed on a semiconductor substrate. Multiple DRAMs are formed on the same substrate, each one being separated at some point late in the manufacturing process to form an integrated circuit known as a memory chip. Memory array 102 includes rows and columns of addressable memory cells. Each memory cell in a row is coupled to a common word line. Additionally, each memory cell in a column is coupled to a common bit line. Each cell in memory array 102 includes a storage capacitor and an access transistor as is conventional in the art.

DRAM 100 interfaces with, for example, microprocessor 104 through address lines 117 and data lines 116. Alternatively, DRAM 100 may interface with a DRAM controller, a microcontroller, a chip set or other electronic system. Microprocessor 104 also provides a number of control signals to DRAM 100, including but not limited to, row and column address strobe signals RAS* and CAS*, write enable signal WE*, an output enable signal OE* and other conventional control signals.

Row address buffer 108 and row decoder 110 receive and decode row addresses from row address signals provided on address lines 117 by microprocessor 104. Each unique row address corresponds to a row of cells in memory array 102. Row decoder 110 includes a word line driver, an address decoder tree, and circuitry which translates a given row address received from row address buffers 108 and selectively activates the appropriate word line of memory array 102 via the word line drivers. Further, when defective rows have been discovered during a probe test at the wafer level while the chip is being manufactured, the unique row address is remapped to a spare row, usually by use of a settable fuse in a row of fuse banks 120 coupled to or within row decoder 110. When remapped, the path to decode the address is longer, and it takes more time for the address to be ready from the row decoder 110.

Column address buffer 112 and column decoder 114 receive and decode column address signals provided on address lines 117. Column decoder 114 also determines when a column is defective and the address of a replacement column. Column decoder 114 is coupled to sense amplifiers 105. Sense amplifiers 105 are coupled to complementary pairs of bit lines of memory array 102. Sense amplifiers 105 include equilibration circuits that bias the complementary bit lines at a selected voltage prior to reading data from a cell of memory array 102. Advantageously, the equilibration circuits are controllably coupled to a reference voltage supply such that the reference voltage supply may be decoupled from the equilibration circuit to prevent current leakage due to a defective column.

Sense amplifiers 105 are coupled to data-in buffer 107 and data-out buffer 106. Data-in buffers 107 and data-out buffers 106 are coupled to data lines 116.

During a write operation, data lines 116 provide data to data-in buffer 107. Sense amplifier 105 receives data from data-in buffer 107 and stores the data in memory array 102 as a charge on a capacitor of a cell at an address specified on address lines 117.

During a read operation, DRAM 100 transfers data to microprocessor 104 from memory array 102. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 105 detects and amplifies a difference in voltage between the complementary bit lines. The sense amplifier passes the amplified voltage to data-out buffer 106.

Advantageously, the reference voltage supply used to equilibrate the bit line in this embodiment may be selectively decoupled from the equilibration circuit using a gating transistor to prevent leakage current due to a defective bit line. This can be accomplished using, for example, a modified column select signal which turns off a transistor coupled between the equilibration circuit and the reference power supply.

Control logic 118 is used to control the many available functions of DRAM 100. It receives address strobe signals from microprocessor 104 and uses them to control the timing of the operation of DRAM 100 as well as the transfer of data to and from microprocessor 104. In prior systems, the control logic 118 received a fast/slow signal from a series of NAND gates coupled by conductive lines to the row fuse banks. When one of the fuses in the fuse banks was set due to the need to replace a defective row of memory, the fast/slow signal was active, indicating that control logic 118 should slow down the RAS* signal at some point in the circuitry carrying the RAS* signal, referred to as the RAS chain, in order to allow more time for the redirection to the redundant row. The RAS* signal is slowed by approximately 2–3 nanoseconds in one embodiment by the simple insertion of well known delay elements in the RAS chain. The high number of redundant rows in higher density DRAM devices lead to larger numbers of conductive lines and NAND and NOR gates to accomplish the slow down. This required much chip real estate, decreasing the area available for memory circuitry.

To greatly reduce the real estate required for accomplishing the slow down, a settable fuse 122 is coupled to control logic 118. The settable fuse comprises one of many types of fuses, including an antifuse or a fuse or any other type of element which can be used to modify current paths. An antifuse operates as a short circuit when fabricated. By applying a large voltage to the antifuse structure, the antifuse becomes "programmed." A programmed antifuse, fabricated as well known to one skilled in the art, operates as a conductor or link in a closed circuit, allowing current to flow through that part of the circuit. In comparison, a fuse operates as a link in a closed circuit when fabricated. The fuse is fabricated and selectively melted by methods well known to one skilled in the art, such as by an electric current, overvoltage or laser. Once the fuse is melted, it operates as an open circuit. Either type of fuse may be used, and in one embodiment, it is the same type of fuse as is used in fuse bank 120.

In a further embodiment, the fuse 122 is located adjacent to, or in the fuse bank 120 and is coupled by a conductive line to control logic 118 to accomplish the same slow down. This greatly simplifies the circuitry required to accomplish the slow down, and since a fuse is being set for substituting a different row of memory cells, the fuse 122 may be set at the same time, either before, after or simultaneously with the row substitution fuse without having to reposition equipment to set the fuse to a different area of the chip. It is very easy to simply blow one more fuse once a fuse must be blown for use of a redundant row.

In yet a further embodiment, fuse 122 is already set in a condition to slow down the RAS chain, and is set when no redundant rows are used such that the RAS chain operates in a fast mode, and data is made available more quickly to the microprocessor 104 just as in the first embodiment, where the fuse is set only when a redundant row is used. Fuses are used, as they may be set late in the manufacturing process, after rows are operable and testable. By only slowing down the RAS chain when a substitute row is actually used, memory chips not using spare rows may be allowed to operate at a higher speed. This provides a higher yield of faster parts when speed graded to approximately 10 nanosecond deltas.

Several other control circuits and signals not detailed herein initiate and synchronize DRAM 100 operation as well known to those skilled in the art. As stated above, the description of DRAM 100 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Figure 3:
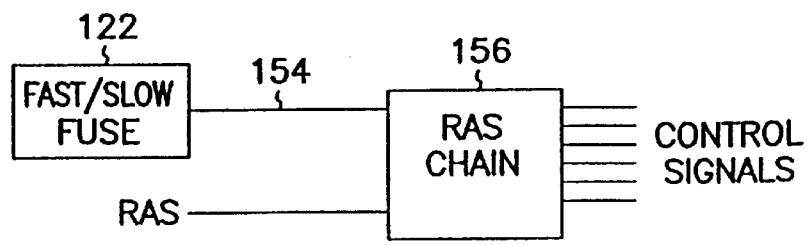
FIG. 3 is a detailed block diagram of the fuse option for fast/slow RAS chain control of FIG. 2.

FIG. 3 shows a detail of the fast slow signal 154 as used to create a fast or slow RAS chain operation. The entire combinational logic tree used to poll the plurality of fuses in the plurality of fuse blanks is replaced, in the preferred embodiment, by a signal fuse 122. At the time of testing and replacement of defective rows with redundant rows, the redundant row fuse is programed and the fast slow fuse 122 is also programmed. The elimination of the combinational logic tree 52, saves a large amount of die area in the memory 100. Those skilled in the art will readily recognize that the type of fuse used in the fuse 122 may be of a wide variety, as described above.

A personal computer is shown in FIG. 4 which includes a monitor 400, a keyboard input device 402 and a central processing unit 404. The processor unit typically includes microprocessor 104, memory bus circuit 408 having a plurality of memory slots which accept DRAM memory chips 100(*a–n*), and other peripheral circuitry 410. Peripheral circuitry 410 permits various peripheral devices 424 to interface processor-memory bus 420 over input/output (I/O) bus 422.

Coupled to memory bus 420 are a plurality of memory slots which receive memory devices 100(*a–n*). For example, single in-line memory modules (SIMMs) and dual in-line memory modules (DIMMs) may be used in the implementation which utilize the teachings of the present invention. Each type of integrated memory device has an associated communications speed which in turn limits the speed data can be read out of or written into memory bus circuit 408.

These memory devices can be produced in a variety of designs which provide different methods of reading from and writing to the dynamic memory cells of memory 112. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 408. A typical communication speed using page mode a DRAM device is approximately 33 MHZ.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 420. Other alternative types of devices include SDRAM, DDR SDRAM, SLDRAM and Direct RDRAM as well as others such as SRAM or Flash memories.

CONCLUSION

It is to be understood that the above description is intended to be illustrative, and not restrictive. Many other embodiments will be apparent to those of skill in the art upon reviewing the above description. As previously mentioned, the use of fuses and antifuses are one design choice, as well as the location of the fuses, and various methods of setting the fuses are well within the scope of the invention. Further, it is well known that DRAM devices are comprised of multiple subarrays, each subarray having corresponding redundant rows, or a bank of redundant rows being provided for all the subarrays. The sizes and numbers of subarrays can also be varied without departing from the invention. Still further, other types of memory devices making use of redundant rows of memory selectable by whatever method may make use of the present invention.

What is claimed is:

1. A method of delaying row address strobe signals in a semiconductor memory device, comprising:

enabling a spare row of memory cells by setting a fuse in a fuse bank; and setting a signal fuse separate from the fuse bank to delay the row address strobe signals.

2. The method of claim 1, wherein the row address strobe signals are delayed more than approximately 2 nanoseconds.

3. A method of delaying row address strobe signals in a semiconductor memory device, comprising:

enabling a spare row of memory cells; and setting a slow down fuse, separate from enabling a spare row of memory cells, in a state to delay the row address strobe signals, wherein setting the slow down fuse occurs substantially simultaneously with enabling the spare row of memory cells.

4. The method of claim 3, wherein the spare row of memory cells are enabled by setting a further fuse.

5. A method of delaying row address strobe signals in a semiconductor memory device, comprising:

probe testing the memory device at a wafer level;

detecting a bad row of memory cells;

setting a redundancy fuse to enable a spare row of memory cells for use in place of the bad row of memory cells; and setting a fast/slow fuse in a state to delay the row address strobe signals independent of enabling the spare row of memory cells in conjunction with enabling the spare row of memory cells for use in place of the bad row of memory cells.

6. The method of claim 5 wherein the redundancy fuse and the fast/slow fuse are set at approximately the same time.

7. The method of claim 5 wherein multiple redundancy fuses are set.

8. A method of delaying row address strobe signals in a semiconductor memory device, comprising:

providing redundant rows of memory cells; and coupling a fast/slow fuse by a conductive line to a control logic in the semiconductor memory device, the fast/ slow fuse set in a condition to slow down a row address strobe chain, wherein the fast/slow fuse is set to another condition when no redundant rows are enabled.

9. The method of claim 8, wherein the method further includes delaying the row address strobe signals by more than approximately 2 nanoseconds.

10. The method of claim 8, wherein coupling a fast/slow fuse includes coupling a laser fuse.

11. A method of delaying row address strobe signals in a semiconductor memory device, comprising:

enabling a spare row of memory cells by setting an antifuse in a bank of antifuses; and setting a signal antifuse separate from the bank of antifuses to delay the row address strobe signals after setting the antifuse in the bank of antifuses to enable the spare row of memory cells, wherein setting the signal antifuse is independent of enabling the spare row of memory cells.

12. The method of claim 11, wherein the method further includes delaying the row address strobe signals by more than approximately 2 nanoseconds.

13. The method of claim 11, wherein the method further includes setting the signal antifuse using a laser.

14. A method of delaying row address strobe signals in a semiconductor memory device, comprising:

testing the semiconductor memory device;

detecting a defective row of memory cells;

setting a redundancy fuse to enable a spare row of memory cells for use in place of the defective row of memory cells; and setting a fast/slow antifuse to delay the row address strobe signals in conjunction with enabling the spare row of memory cells for use in place of the defective row of memory cells, wherein setting the fast/slow antifuse is independent of enabling the spare row of memory cells.

15. The method of claim 14, wherein setting the fast/slow antifuse occurs before setting the redundancy fuse.

16. The method of claim 14, wherein setting the fast/slow antifuse occurs substantially simultaneously with setting the redundancy fuse.

17. A method of delaying row address strobe signals in a semiconductor memory device, comprising:

testing the semiconductor memory device at a wafer level;

determining if the semiconductor memory device has a defective row of memory cells;

remapping a unique row address associated with the defective row of memory cells to a spare row of memory cells; and setting a fast/slow fuse to delay the row address strobe signals in conjunction with remapping the unique row address, wherein setting the fast/slow fuse is independent of remapping the unique row address.

18. The method of claim 17, wherein setting the fast/slow fuse occurs before remapping the unique row address.

19. The method of claim 17, wherein setting the fast/slow fuse occurs after remapping the unique row address.

20. A method of delaying row address strobe signals in a semiconductor memory device, comprising:

testing the semiconductor memory device at a wafer level;

determining if the semiconductor memory device has a defective row of memory cells;

remapping a unique row address associated with the defective row of memory cells to a spare row of memory cells; and setting a fast/slow fuse to delay the row address strobe signals substantially simultaneously with remapping the unique row address, wherein setting the fast/slow fuse is independent of remapping the unique row address.

21. The method of claim 20, wherein the method further includes delaying the row address strobe signals by more than approximately 2 nanoseconds.

22. The method of claim 20, wherein the method further includes setting the fast/slow fuse using an overvoltage.

23. A method of delaying row address strobe signals in a semiconductor memory device, comprising:

remapping a unique row address associated with a defective row of memory cells to a spare row of memory cells; and setting a fuse to delay the row address strobe signals in conjunction with remapping the unique row address, wherein setting the fuse is independent of remapping the unique row address.

24. The method of claim 23, wherein setting the fuse occurs substantially simultaneously with remapping the unique row address.

25. The method of claim 23, wherein setting the fuse occurs before remapping the unique row address.

* * * * *